(12) United States Patent
Guerry et al.

(10) Patent No.: US 11,447,237 B2
(45) Date of Patent: Sep. 20, 2022

(54) ACTIVELY-CONTROLLED SUPERHYDROPHOBIC SURFACES

(71) Applicant: The Boeing Company, Chicago, IL (US)

(72) Inventors: Joshua Benjamin Guerry, Daniel Island, SC (US); Peter Aaron Koch, Kent, WA (US); Li Chun Chang, Mt. Pleasant, SC (US); Robert Hans Thim, Woodinville, WA (US)

(73) Assignee: The Boeing Company, Chicago, IL (US)

( * ) Notice: Subject to any disclaimer, the term of this patent is extended or adjusted under 35 U.S.C. 154(b) by 457 days.

(21) Appl. No.: 16/508,082

(22) Filed: Jul. 10, 2019

(65) Prior Publication Data

US 2019/0329872 A1    Oct. 31, 2019

Related U.S. Application Data

(63) Continuation of application No. 14/522,255, filed on Oct. 23, 2014, now abandoned.

(51) Int. Cl.
*B64C 21/10* (2006.01)
*B08B 17/06* (2006.01)
(Continued)

(52) U.S. Cl.
CPC ............ *B64C 21/10* (2013.01); *B08B 17/065* (2013.01); *B64D 15/00* (2013.01); *B64D 15/12* (2013.01);
(Continued)

(58) Field of Classification Search
CPC ........... B64C 21/10; B64D 15/00; B81B 3/00; B81B 3/0094; B81B 7/0029; B81B 7/02; B81B 7/04; B81B 17/065
See application file for complete search history.

(56) References Cited

U.S. PATENT DOCUMENTS 4,732,351 A   3/1988   Bird
6,194,685 B1   2/2001   Rutherford
(Continued)

FOREIGN PATENT DOCUMENTS

CN      101704410      5/2010

OTHER PUBLICATIONS

Machine generated English language translation of abstract for CN 101704410 downloaded from Espacenet.com on Apr. 27, 2016.
(Continued)

*Primary Examiner* — Michael H Wang
(74) *Attorney, Agent, or Firm* — Dascenzo Gates Intellectual Property Law, P.C.

(57) ABSTRACT

Active superhydrophobic surface structures are actively-controlled surface structures exhibiting a superhydrophobic state and an ordinary state. Active superhydrophobic surface structures comprise an outer elastomeric covering defining an exposed surface, a controlled group of MEMS (micro-electro-mechanical system) actuators at least covered by the elastomeric covering, and, a controlled region of the exposed surface corresponding to the controlled group. The controlled region has a superhydrophobic state in which the controlled region is textured. The controlled region also has an ordinary state in which the controlled region is smooth (i.e., less textured than in the superhydrophobic state). Active superhydrophobic surface structures may be part of an apparatus that includes a controller and/or one or more sensors. The controller, sensors, and the controlled region may form a feedback loop in which the active superhydrophobic surface is actively controlled.

25 Claims, 4 Drawing Sheets

(51) Int. Cl.
  B64D 15/12    (2006.01)
  B64D 15/16    (2006.01)
  B64D 15/00    (2006.01)
  B81C 1/00     (2006.01)
  B81B 3/00     (2006.01)
  B81B 7/00     (2006.01)
  B81B 7/02     (2006.01)
  B81B 7/04     (2006.01)

(52) U.S. Cl.
  CPC ......... *B64D 15/163* (2013.01); *B81B 3/0094* (2013.01); *B81B 7/0029* (2013.01); *B81B 7/02* (2013.01); *B81B 7/04* (2013.01); *B81C 1/00206* (2013.01); *Y02T 50/10* (2013.01)

(56) References Cited

U.S. PATENT DOCUMENTS

| | | |
|---|---|---|
| 6,890,152 B1 | 5/2005 | Thisted |
| 6,994,045 B2 | 2/2006 | Paszkowski |
| 7,678,997 B2 | 3/2010 | Rawlings |
| 7,770,453 B2 | 8/2010 | Ludwiczak |
| 8,217,554 B2 | 7/2012 | Royer, Jr. et al. |
| 2006/0115623 A1 | 6/2006 | Aizenberg et al. |
| 2009/0001222 A1 | 1/2009 | McKeon |
| 2009/0011222 A1 | 1/2009 | Xiu et al. |
| 2011/0280723 A1 | 11/2011 | Libergren |
| 2011/0287223 A1 | 11/2011 | Victor et al. |
| 2012/0181346 A1 | 7/2012 | Greer et al. |
| 2012/0258283 A1 | 10/2012 | Sohn et al. |
| 2012/0269645 A1 | 10/2012 | Narasimalu et al. |
| 2012/0276334 A1 | 11/2012 | Fedynyshyn et al. |
| 2014/0017454 A1 | 1/2014 | Boyce et al. |
| 2014/0113144 A1* | 4/2014 | Loth ............... C09D 7/61 428/421 |
| 2014/0150814 A1 | 6/2014 | Peltz |
| 2015/0044420 A1* | 2/2015 | Nowak ............ B05D 5/08 428/141 |
| 2015/0378434 A1 | 12/2015 | Baskaran |

OTHER PUBLICATIONS

European Patent Office, Extended European Search Report for related European patent application EP 15 19 0974, dated Mar. 11, 2016.

European Patent Office, Examination Report for related European Patent Application No. 15 190 974.4, dated Feb. 16, 2017.

* cited by examiner

ACTIVELY-CONTROLLED SUPERHYDROPHOBIC SURFACES

RELATED APPLICATION

This application is a continuation of and claims priority to U.S. patent application Ser. No. 14/522,255, filed on Oct. 23, 2014, and entitled ACTIVELY-CONTROLLED SUPERHYDROPHOBIC SURFACES, the disclosure of which is incorporated herein by reference.

FIELD

The present disclosure relates to actively-controlled superhydrophobic surfaces.

BACKGROUND

Superhydrophobicity is a physical property of a surface on which wetting is relatively difficult. Water drops on a superhydrophobic surface tend to bead and roll off the surface rather than stick to the surface. Superhydrophobic surfaces also may be ice resistant (e.g., due to a lack of water on the surface) and/or self-cleaning (e.g., due to water on the surface carrying away contaminants).

Water, ice, and surface contamination are significant problems in various industries including transportation, power, buildings, and consumer products. For example, ice accumulation can reduce the performance of aircraft, watercraft, and wind turbines. As another example, solar panels and electronic displays are subject to surface contamination that reduces performance and/or usability.

Though superhydrophobic surfaces may be beneficial in some situations (such as during use, cleaning, wet conditions, condensing conditions, and/or icing conditions), in other situations a superhydrophobic surface may reduce performance and/or utility of an apparatus.

Conventional superhydrophobic surface structures are passive structures and generally relatively delicate structures. The superhydrophobic surface structure may wear with use and/or may be damaged by use. In particular, many industrial and consumer uses subject devices to harsh conditions (e.g., thermal, abrasive, and/or chemical conditions such as may be experienced during environmental exposure, repeated handling, icing conditions, and/or high speed flight). Once sufficiently worn or damaged, the superhydrophobic surface structure loses its superhydrophobicity and therefore its effectiveness.

SUMMARY

Active superhydrophobic surface structures are actively-controlled surface structures exhibiting a superhydrophobic state and an ordinary state. Active superhydrophobic surface structures comprise an outer elastomeric covering defining an exposed surface, a controlled group of one or more MEMS (micro-electro-mechanical system) actuators at least covered by the elastomeric covering, and, a controlled region of the exposed surface corresponding to the controlled group. The controlled region has a superhydrophobic state in which the controlled region is textured. The controlled region also has an ordinary state in which the controlled region is smooth (i.e., less textured than in the superhydrophobic state).

Active superhydrophobic surface structures may be a component of an apparatus such as a vehicle (e.g., an aircraft). The apparatus may include a controller and/or one or more sensors. The controller may be configured to control the controlled region of the active superhydrophobic surface structure based on information from the sensors. Further, the controller, sensors, and the controlled region may form a feedback loop in which the active superhydrophobic surface is actively controlled.

DESCRIPTION

Actively-controlled superhydrophobic surfaces, apparatuses including the same, and methods of use are disclosed herein. In general, in the drawings, elements that are likely to be included in a given embodiment are illustrated in solid lines, while elements that are optional or alternatives are illustrated in dashed lines. However, elements that are illustrated in solid lines are not essential to all embodiments of the present disclosure, and an element shown in solid lines may be omitted from a particular embodiment without departing from the scope of the present disclosure. Elements that serve a similar, or at least substantially similar, purpose are labeled with numbers consistent among the figures. Like numbers in each of the figures, and the corresponding elements, may not be discussed in detail herein with reference to each of the figures. Similarly, all elements may not be labeled in each of the figures, but reference numerals associated therewith may be used for consistency. Elements, components, and/or features that are discussed with reference to one or more of the figures may be included in and/or used with any of the figures without departing from the scope of the present disclosure.

Figure 1:
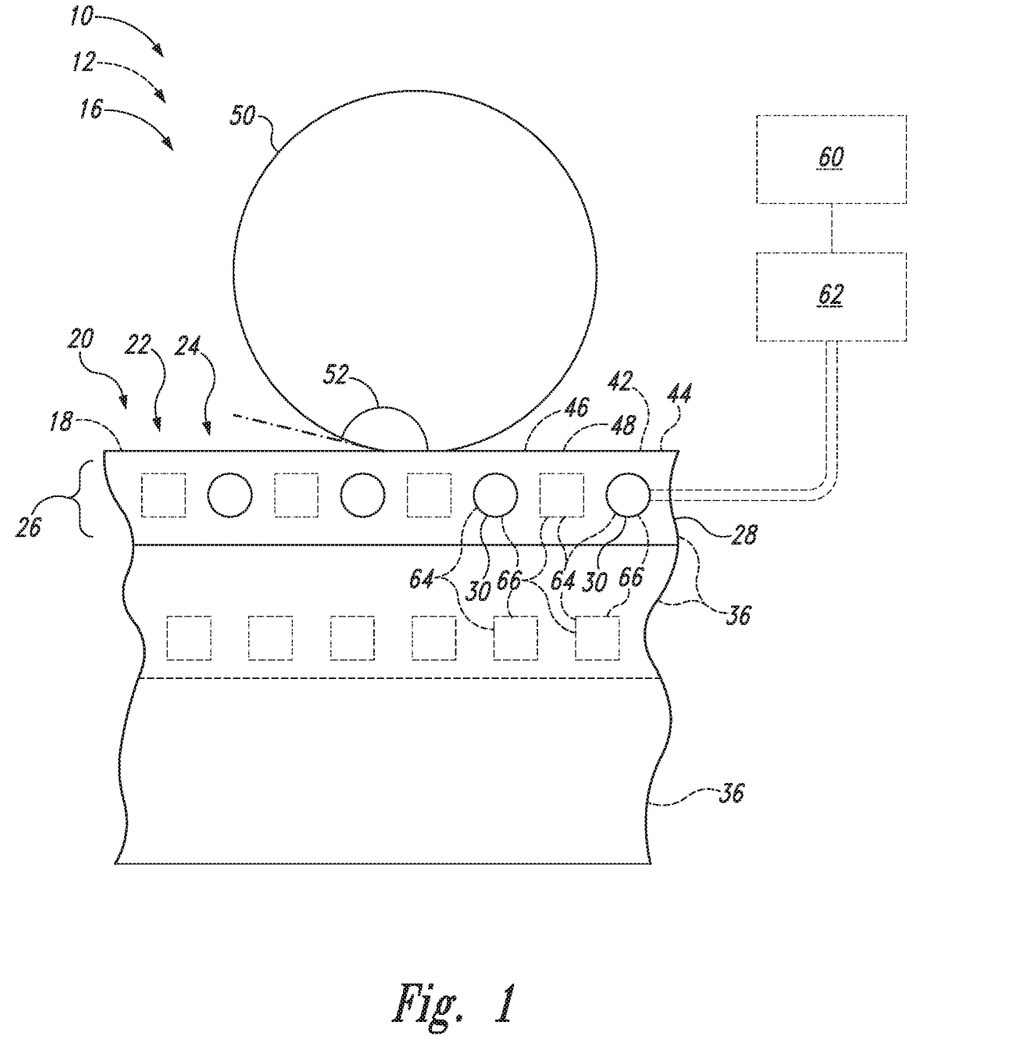
FIG. 1 is a schematic representation of apparatuses with active superhydrophobic surface structures.

FIG. 1 is a schematic representation of an apparatus 10 comprising a body 16 with an exposed surface 20. The body 16 includes at least one active superhydrophobic surface structure 22 (an actively-controlled surface structure). Active superhydrophobic surface structures 22 include an outer elastomeric covering 28 defining the exposed surface 20, a controlled group 26 of one or more MEMS (micro-electro-mechanical system) actuators 30 at least covered by the elastomeric covering 28, and a controlled region 24 of the exposed surface 20 corresponding to the controlled group 26. The controlled region 24 may be in a superhydrophobic state 42, where the controlled region 24 is textured, or in an ordinary state 44, where the controlled region 24 is 'smooth.' As used herein, where the controlled region 24 in the ordinary state 44 is described as smooth, the controlled region 24 is smoother (i.e., less textured) than when in the superhydrophobic state 42. As used herein, where the controlled region 24 in the superhydrophobic state 42 is described as textured, the controlled region 24 includes at least one more protruding feature than when in the ordinary state 44. The controlled region 24 may have additional states and/or may be in an admixture of the superhydrophobic state 42 and the ordinary state 44.

Spatially relative terms, e.g., "below," "bottom," "inner," "above," "top," "outer," and the like, used with respect to the apparatus 10 and components of the apparatus 10 refer to positions relative to the exposed surface 20. As used herein, components within the active superhydrophobic surface structure 22 that are closer to the exposed surface 20 are above components further away from the exposed surface 20. As also used herein, the exposed surface 20 is the topmost surface, and the outer surface, of the active superhydrophobic surface structure 22.

Active superhydrophobic surface structures 22 are configured to selectively transition the controlled region 24 between the superhydrophobic state 42 and the ordinary state 44 by actuating the MEMS actuator(s) 30 of the controlled group 26. Active superhydrophobic surface structures 22 may include a plurality of controlled groups 26 and a corresponding plurality of controlled regions 24. Thus, active superhydrophobic surface structures 22 may have a plurality of controlled regions 24 that may be independently transitioned between superhydrophobic states 42 and ordinary states 44.

Controlled regions 24 in the superhydrophobic state 42 are superhydrophobic surfaces. Thus, the active superhydrophobic surface structure 22 with the controlled region(s) 24 in the superhydrophobic state 42 is configured to shed water, avoid water drop wetting, and/or to reduce drag when the body 16 travels through water. Additionally, the superhydrophobic state 42 may be configured to shed ice, avoid ice accumulation, and/or to prevent ice accumulation, and, thus, may be icephobic. Further, the superhydrophobic state 42 may be configured to shed oil and/or to avoid oil drop wetting, and, thus may be oleophobic. The superhydrophobic state 42 may be configured for self-cleaning action and/or contamination resistance due to its superhydrophobicity, its optional icephobicity, its optional oleophobicity, and/or the surface geometry of the controlled region 24. Specifically, the controlled region 24 in the superhydrophobic state 42 may not adhere tightly to oil, dirt, and/or other contaminants that may accumulate on the controlled region 24. Due to the superhydrophobicity, water on the controlled region 24 in the superhydrophobic state 42 tends to roll off the controlled region 24 and, hence, the water travelling across the controlled region 24 may push oil, dirt, and/or other contaminants off the controlled region 24.

Controlled regions 24 in the ordinary state 44 are less (super)hydrophobic than in the superhydrophobic state 42. Controlled regions 24 may be superhydrophobic, hydrophobic, hydrophilic, icephobic, oleophobic, oleophilic, and/or not superhydrophobic.

Hydrophobic surfaces typically are defined by a water contact angle 52 of greater than 90°. The water contact angle 52 is the angle inside a water drop 50 measured between the surface and the tangent of the water drop 50 at the contact point. Hydrophobic surfaces may have non-polar and/or hydrophobic surface chemistries, and/or may have a low surface energy for water contact. Hydrophobic surfaces generally are not highly wettable and may include macroscopic and/or microscopic surface structure to deter wetting (e.g., non-polar regions, microstructures, and/or nanostructures).

Superhydrophobic surfaces are highly hydrophobic surfaces, typically defined by a water contact angle 52 of greater than 150°. The contact angle 52 of water with the controlled region 24 in the superhydrophobic state 42 may be greater than 150°, greater than 160°, and/or greater 170°. The contact angle 52 of water with the controlled region 24 in the superhydrophobic state 42 is greater than the contact angle 52 of water with the controlled region 24 in the ordinary state 44. For example, the contact angle 52 of water with the controlled region 24 in the ordinary state 44 may be less than 160°, less than 150°, less than 120°, less than 100°, less than 90°, less than 80, less than 70°, less than 60°, greater than 70°, greater than 80°, greater than 90°, greater than 100°, greater than 120°, and/or greater than 150°.

Superhydrophobic surfaces also typically include surface structure configured to deter wetting. The superhydrophobic state 42 of the controlled region 24 is a textured state where the exposed surface 20 has surface structure configured to establish and/or enhance superhydrophobicity. The ordinary state 44 of the controlled region 24 is a 'smooth' state that has less texture than the superhydrophobic state 42. For example, the average surface roughness of the controlled region 24 in the superhydrophobic state 42 may be greater than the average surface roughness of the controlled region 24 in the ordinary state 44. The controlled region 24 in the superhydrophobic state 42 may have an average surface roughness of less than 100,000 nm (nanometers), less than 10,000 nm, less than 3,000 nm, less than 1,000 nm, less than 300 nm, less than 100 nm, greater than 10 nm, greater than 30 nm, greater than 100 nm, greater than 300 nm, and/or greater than 1,000 nm. The controlled region 24 in the ordinary state 44 may have an average surface roughness of less than 3,000 nm, less than 1,000 nm, less than 300 nm, less than 100 nm, less than 30 nm, less than 10 nm, greater than 1 nm, greater than 10 nm, greater than 30 nm, greater than 100 nm, and/or greater than 300 nm.

Active superhydrophobic surface structures 22 may be useful where water repelling, lack of wetting, low hydrodynamic drag, ice repelling, de-icing, easy cleaning, and/or self cleaning are desirable. Apparatus 10 may be, but are not required to be, exterior structures with the exposed surface 20 exposed to the atmosphere and/or the local environment. For example, apparatus 10 may be, and/or may include, a vehicle (such as an aircraft, an unmanned aerial vehicle, a rotorcraft, a land vehicle, a watercraft, and/or a spacecraft), a wind turbine, a tower, an electronic component (such as an amplifier, a networking appliance, and/or an antenna), a consumer electronic product (such as a cell phone, a camera, and/or a computer), a medical device, a hydraulic component, a pump, a mirror, a window, a solar panel, an electronic display, a touchscreen display, an optic, glasses, goggles, a building material (such as siding and/or wall panels), a building exterior, a textile (such as clothing, bags, and/or luggage), a packaging container, and/or an envelope. More particularly, e.g., where the apparatus 10 is a fixed or mobile structure (such as a wind turbine or a vehicle 12), the body 16 may include, and/or may be, an airfoil, an aerodynamic component, a hull, a hydrodynamic component, a casing, a windshield, a nose cone, a radome, a superstructure, a wing, a tailplane, a horizontal stabilizer, a vertical stabilizer, an empennage, a fuselage, a skin, a propeller blade, a rotor blade, a turbine blade, a nacelle, and/or an engine cowling.

Figure 2:
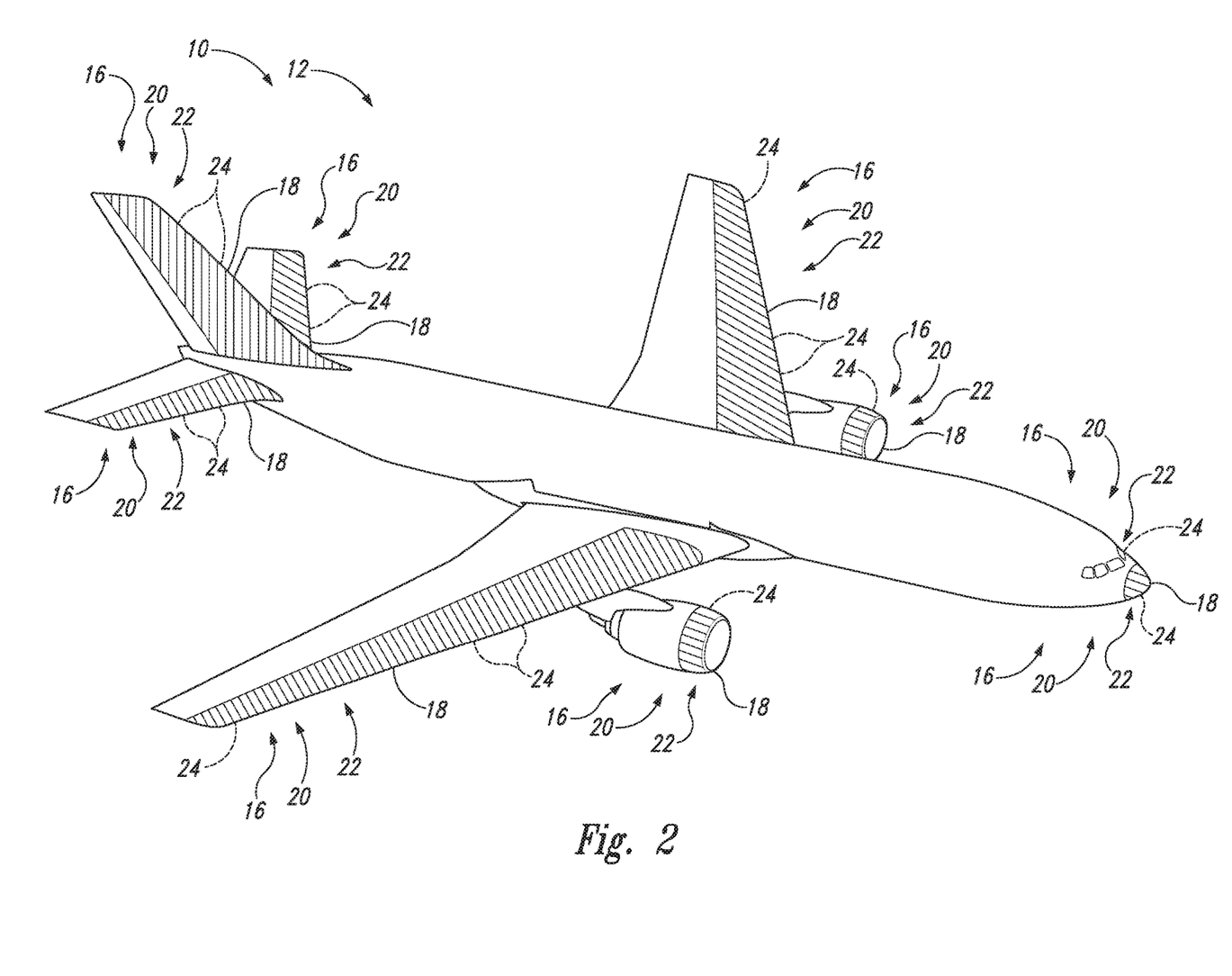
FIG. 2 is a perspective drawing of an example vehicle (an aircraft) illustrating several possible locations for active superhydrophobic surface structures.

FIG. 2 illustrates several possible locations for active superhydrophobic surface structures 22 on a particular type of vehicle 12, an aircraft. As also illustrated in FIG. 2, the body 16 may include, and/or may be, an aerodynamic component and/or an airfoil that has a leading edge 18 (e.g., the front of the wings, etc.). The active superhydrophobic surface structure 22 may be proximate to, and/or include, the leading edge 18 of the airfoil and/or the aerodynamic component (e.g., the controlled region 24 may or may not include the leading edge 18, and the controlled region 24 may be proximate to the leading edge 18). Additionally or alternatively, the active superhydrophobic surface structure 22 may be oriented relative to the leading edge 18. For example, the active superhydrophobic surface structure 22 may be elongated with an elongated direction oriented parallel, substantially parallel, oblique, perpendicular, and/or substantially perpendicular to the leading edge. On certain airfoils and/or aerodynamic surfaces without a deicing mechanism, ice tends to form near the leading edge. Hence, incorporating active superhydrophobic surface structures 22 including, abutting, and/or proximate to the leading edge 18 may prevent ice accumulation and/or assist ice removal.

Returning to FIG. 1, the outermost (or topmost) component of the active superhydrophobic surface structure 22 is the elastomeric covering 28, i.e., the elastomeric covering 28 defines at least a portion of the exposed surface 20. The elastomeric covering 28 is configured to distort under the influence of the MEMS actuator(s) 30 of the controlled group 26. Thus, motion of the MEMS actuator(s) 30 of the controlled group 26 affects the surface shape of the controlled region 24 of the exposed surface 20. The elastomeric covering 28, without any distortions induced by the MEMS actuator(s) 30, may be superhydrophobic, hydrophobic, hydrophilic, oleophobic, oleophilic, and/or not superhydrophobic. Generally, the undistorted exposed surface 20 of the elastomeric covering 28 is the ordinary state 44 of the controlled region 24 of the exposed surface 20 and the distorted exposed surface 20 of the elastomeric covering 28 is the superhydrophobic state 42 of the controlled region 24 of the exposed surface 20. However, the elastomeric covering 28 may be configured such that the undistorted exposed surface 20 of the elastomeric covering 28 is the superhydrophobic state 42 and the distorted exposed surface 20 of the elastomeric covering 28 is the ordinary state 44.

The elastomeric covering 28 covers the controlled group 26, directly or indirectly contacting at least a portion of each of the MEMS actuators 30 of the controlled group 26. The elastomeric covering 28 may encase one or more (e.g., all) of the MEMS actuators 30 of the controlled group 26. The elastomeric covering 28 may include, and/or may consist essentially of, silicone, polydimethylsiloxane, polyurethane, fluoropolymer, and/or pigment. The elastomeric covering 28, and the active superhydrophobic surface structure 22 as a whole, may be optically transparent, absorbing, scattering, and/or pigmented. Hence, the elastomeric covering 28 and/or the active superhydrophobic surface structure 22 may be applied to and/or may be integral with transparent structures (e.g., transparent bodies 16) and/or opaque structures (e.g., opaque bodies 16, paint, and/or exterior coatings). The elastomeric covering 28 may protect the controlled group 26 and/or the underlying structure from damage and/or environmental contamination.

Active superhydrophobic surface structures 22 and/or bodies 16 may be layered and/or laminated structures, optionally including one or more layers 36. For example, active superhydrophobic surface structures 22 and/or bodies 16 may include, and/or may be, a laminate composite material such as a fiber-reinforced composite. Each layer 36 of the layered and/or laminated structure may independently include carbon fiber, aramid fiber, glass fiber, resin, epoxy, and/or elastomer. When the active superhydrophobic surface structure 22 is formed entirely of a layered and/or laminated structure, the topmost layer 36 is the elastomeric covering 28.

Different functional and non-functional elements of the active superhydrophobic surface structures 22 and/or bodies 16 may be distributed within and/or among the layers 36. For example, the MEMS actuator(s) 30 may be arranged in a layer 36, e.g., a layer 36 of the elastomeric covering 28. Electronic components (such as MEMS actuator(s) 30) may be electrically interconnected and/or connected to electrical systems (e.g., a controller 62, as described further herein) via electrical wiring embedded in the active superhydrophobic surface structures 22, the bodies 16, and/or the layers 36. As another example, the active superhydrophobic surface structure 22 may be a surface layer 36 of the body 16, with the body 16 otherwise providing support for the active superhydrophobic surface structure 22 and/or the apparatus 10.

The controlled group 26 of MEMS actuator(s) 30 is configured to selectively transition the controlled region 24 between the superhydrophobic state 42 and the ordinary state 44 by actuation of the MEMS actuator(s) 30. The actuation of the MEMS actuator(s) 30 distorts the exposed surface 20 of the elastomeric covering 28, causing a local change in texture (e.g., surface roughness) corresponding to the change between the superhydrophobic state 42 and the ordinary state 44.

Figure 3:
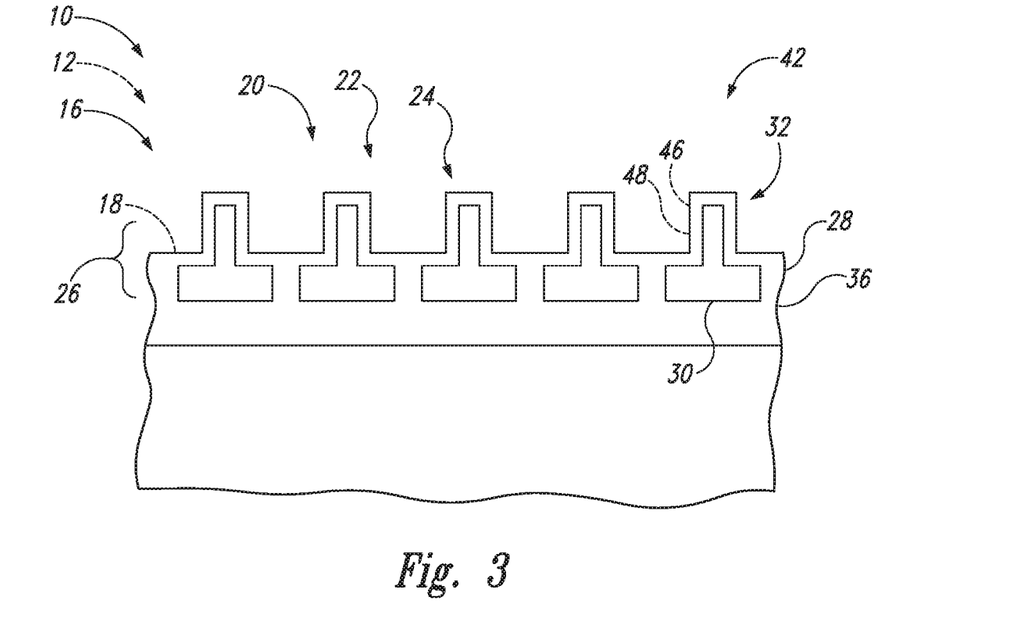
FIG. 3 is a schematic representation of an example of an active superhydrophobic surface structure with MEMS actuators in an activated state representing one of several geometries which may be generated.
Figure 4:
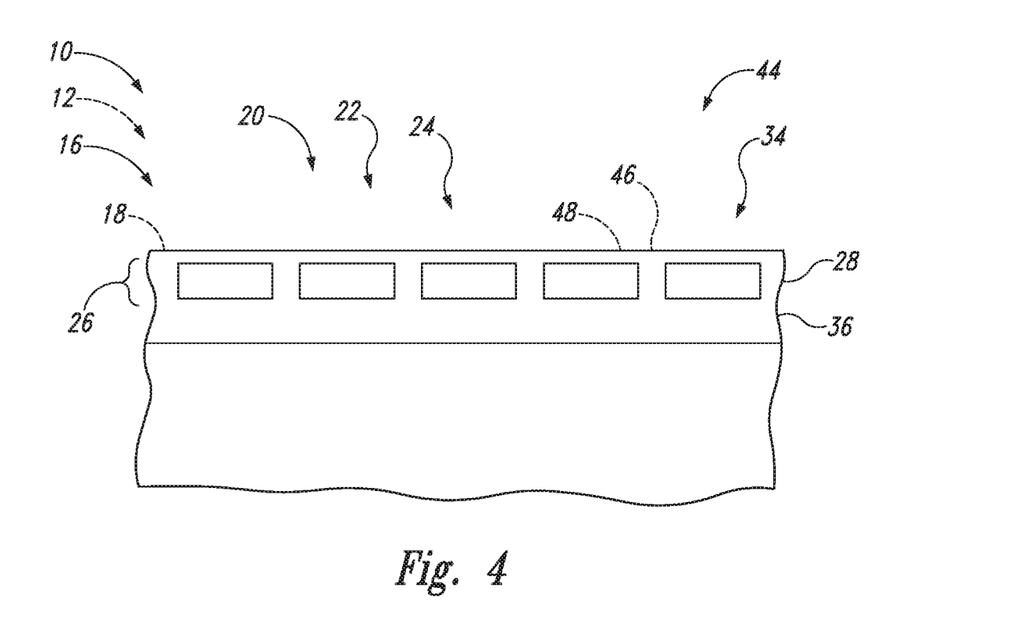
FIG. 4 is a schematic representation of an example of an active superhydrophobic surface structure with MEMS actuators in a deactivated state.

Each MEMS actuator 30 may have an activated state 32 and a deactivated state 34 (as schematically represented in the respective examples of FIGS. 3 and 4). In the activated state 32, the MEMS actuator 30 deforms, deflects, and/or modifies a portion of the controlled region 24. In the deactivated state 34, the MEMS actuator 30 does not deform, deflect, or modify the controlled region 24 and, thus, the controlled region 24 is unaffected and/or unmodified by the MEMS actuator 30 in the deactivated state 34. Though in the examples of FIGS. 3 and 4, the activated state 32 distorts the controlled region 24 to form a more textured controlled region 24 (e.g., the superhydrophobic state 42) and the deactivated state 34 puts the controlled region 24 into a smoother state (e.g., the ordinary state 44), the activated state 32 and the deactivated state 34 may have the opposite effects. That is, the unaffected and/or unmodified shape of the controlled region 24 (i.e., the shape of the exposed surface 20 of the elastomeric covering 28) may be relatively textured (hence, the MEMS actuator(s) 30 may be configured to reduce the texture upon activation) or relatively smooth (hence, the MEMS actuator(s) 30 may be configured to reduce the smoothness and increase the texture upon activation).

The superhydrophobic state 42 of the controlled region 24 may correspond to all MEMS actuator(s) 30 of the controlled group 26 being in the activated state 32 (as shown in FIG. 3) or all being in the deactivated state 34. The related ordinary state 44 of the controlled region 24 may correspond to all MEMS actuator(s) 30 of the controlled group 26 being in the opposite (deactivated/activated) state (i.e., all being in the deactivated state 34, as shown in FIG. 4, or all being in the activated state 32).

Figure 5:
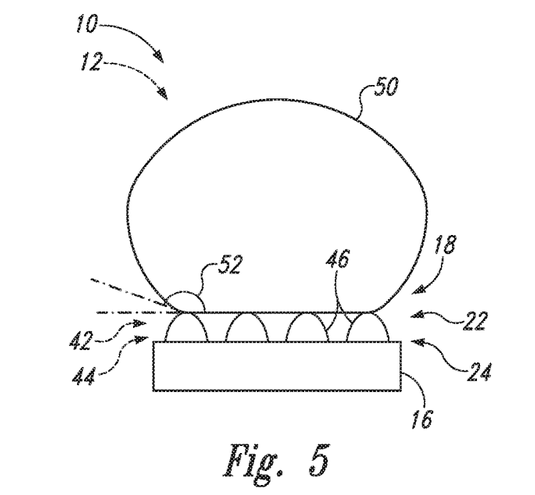
FIG. 5 is a schematic representation of an example of an active superhydrophobic surface structure with microprotrusions holding a water drop.
Figure 6:
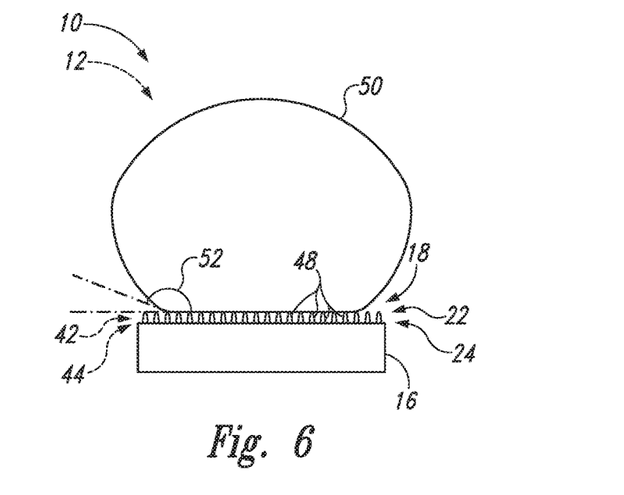
FIG. 6 is a schematic representation of an example of an active superhydrophobic surface structure with nanoprotrusions holding a water drop.
Figure 7:
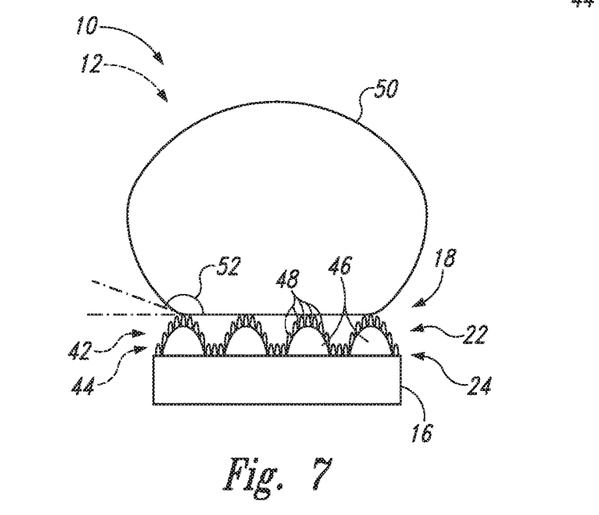
FIG. 7 is a schematic representation of an example of an active superhydrophobic surface structure with a hierarchical combination of microprotrusions and nanoprotrusions holding a water drop.

As illustrated in the examples of FIGS. 5-7, controlled regions 24 have a micro-textured surface (FIG. 5), a nano-textured surface (FIG. 6), and/or a hierarchically textured surface (FIG. 7). Micro-textured, nano-textured, and hierarchically textured also may be called micro-roughness, nano-roughness, and hierarchical roughness, respectively. The textured surfaces may be configured to increase the hydrophobicity of the controlled region 24 (relative to the same material and surface without the textured surface).

The controlled region 24 in the superhydrophobic state 42 and/or in the ordinary state 44 may be micro-textured, nano-textured, and/or hierarchically textured. However, generally the superhydrophobic state 42 and the ordinary state 44 are distinguished by more texture in the superhydrophobic state 42 than the ordinary state 44. For example, if the ordinary state 44 lacked any small-scale texture, the superhydrophobic state 42 may be micro-textured, nano-textured, and/or hierarchically textured. As another example, the ordinary state 44 may be nano-textured and the superhydrophobic state 42 may be micro-textured and/or hierarchically textured. As yet another example, the ordinary state 44 may be micro-textured and the superhydrophobic state 42 may be nano-textured and/or hierarchically textured.

Micro-textured surfaces, as illustrated in the example of FIG. 5, include a plurality of microprotrusions 46 (micron-scaled features). The MEMS actuator(s) 30 may be configured to selectively form the microprotrusions 46 and/or to selectively eliminate the microprotrusions 46. Microprotrusions 46 are configured to trap gas between a water drop 50 on the controlled region 24 and the controlled region 24. Microprotrusions 46 may include, and/or may be, columns, posts, pins, filaments, ridges, ribs, cones, pyramids, lobes, projections, and/or convexities. Additionally, microprotrusions 46 may include interconnecting webs, membranes, and/or other structures connecting two or more microprotrusions 46 together. Microprotrusions 46 may be arrayed across the controlled region 24 (in a regular, irregular, and/or random arrangement) and may be spaced apart from one another with an average spacing of less than 100 µm (micron), less than 30 µm, less than 10 µm, less than 3 µm, less than 1 µm, greater than 1 µm, greater than 3 µm, greater than 10 µm, and/or greater than 30 µm. The spaces between the microprotrusions 46 may be referred to as microcavities. Microprotrusions 46 may have an average height of less than 100 µm, less than 30 µm, less than 10 µm, less than 3 µm, less than 1 µm, greater than 1 µm, greater than 3 µm, greater than 10 µm, and/or greater than 30 µm.

Nano-textured surfaces, as illustrated in the example of FIG. 6, include a plurality of nanoprotrusions 48 (nanometer-scaled features). Nanoprotrusions 48 are smaller than microprotrusions 46 and may be much smaller than microprotrusions 46. The MEMS actuator(s) 30 may be configured to selectively form the nanoprotrusions 48 and/or to selectively eliminate the nanoprotrusions 48. Nanoprotrusions 48 are configured to trap gas between a water drop 50 on the controlled region 24 and the controlled region 24. Nanoprotrusions 48 may include, and/or may be, asperities, columns, posts, pins, filaments, ridges, ribs, clusters, particles, lobes, projections, and/or convexities. Additionally, nanoprotrusions 48 may include interconnecting webs, membranes, and/or other structures connecting two or more nanoprotrusions 48 together. Nanoprotrusions 48 may be arrayed across the controlled region 24 (in a regular, irregular, and/or random arrangement) and may be spaced apart from one another with an average spacing of less than 1,000 nm, less than 300 nm, less than 100 nm, less than 30 nm, less than 10 nm, less than 3 nm, greater than 1 nm, greater than 3 nm, greater than 10 nm, greater than 30 nm, and/or greater than 100 nm. The spaces between the nanoprotrusions 48 may be referred to as nanocavities. Nanoprotrusions 48 may have an average height of less than 1,000 nm, less than 300 nm, less than 100 nm, less than 30 nm, less than 10 nm, less than 3 nm, greater than 1 nm, greater than 3 nm, greater than 10 nm, greater than 30 nm, and/or greater than 100 nm.

Hierarchically textured surfaces, as illustrated in the example of FIG. 7, include a plurality of microprotrusions 46 and a plurality of nanoprotrusions 48 interspersed with one another. On hierarchically textured surfaces, nanoprotrusions 48 may be on top of and/or project from microprotrusions 46. The MEMS actuator(s) 30 may be configured to selectively form and/or to selectively eliminate microprotrusions 46 and/or nanoprotrusions 48. For example, the MEMS actuator(s) 30 may selectively form and/or eliminate at least one of the microprotrusions 46 and/or at least one of the nanoprotrusions 48.

Returning to FIG. 1, MEMS actuators 30 are small electro-mechanical devices that typically are formed using microfabrication and/or nanofabrication techniques. MEMS actuators 30 also may be called microsystems actuators, micromachined actuators, nano-electro-mechanical system (NEMS) actuators, nanosystems actuators, and/or nanomachined actuators. The physical dimensions of MEMS actuators 30 generally are between about one micron and several millimeters, though MEMS actuators may include larger or smaller structures, e.g., structures as small as one atom. MEMS actuators 30 include a moving element configured to change shape upon application of an electrical signal. Examples of MEMS actuators 30 include electrostatic actuators, thermal actuators, piezoelectric actuators, electromagnetic actuators, thermopneumatic actuators, thin film bulk acoustic resonators, and bent beam thermal actuators. MEMS actuators 30 typically are fabricated on and/or from semiconductor substrates and may include a piezoelectric material, a shape memory material, and/or a bimetallic material. Further descriptions of MEMS actuators suitable to be a MEMS actuator 30 may be found in Girbau, D., et al., "RF MEMS Switches Based on the Buckle-beam Thermal Actuator," 33rd European Microwave Conf. Proc. 2, pp. 651-654 (2003) and Wang. K., et al., "Micromachined Bulk Acoustical-wave RF Filters," 7th Intl. Conf. on Solid-State and Integrated Circuits Technology Proc., pp. 1687-1690 (2004). The disclosures of Girbau et al. and Wang et al. are herein incorporated by reference for all purposes.

A single MEMS actuator 30 may be configured to selectively form and/or eliminate one or more microprotrusions 46 and/or nanoprotrusions 48. The MEMS actuators 30 may be arrayed under the controlled region 24 (in a regular, irregular, and/or random arrangement) and/or arranged in a layer 36 (e.g., within the elastomeric covering 28). MEMS actuators 30 may be spaced apart from one another with an average spacing of less than 100 µm, less than 30 µm, less than 10 µm, less than 3 µm, less than 1 µm, less than 0.3 µm, less than 0.1 µm, greater than 0.1 µm, greater than 0.3 µm, greater than 1 µm, greater than 3 µm, greater than 10 µm, and/or greater than 30 µm. MEMS actuators 30 may be disposed under the controlled region 24 at a surface density of at least 100, at least 1,000, at least 10,000, at least 100,000, at least 1,000,000, at most 10,000,000, at most 1,000,000, at most 100,000, at most 10,000, and/or at most 1,000 per square centimeter.

Active superhydrophobic surface structures 22 may comprise a plurality of vibration generators 64 that are configured to selectively vibrate the controlled region 24 and/or to selectively impart a sonic shock into the controlled region 24. Vibration generators 64 may impart sonic energy (e.g., infrasonic, acoustic, and/or ultrasonic energy) into the controlled region 24. Additionally or alternatively, vibration generators 64 may impart a sonic shock that propagates to the controlled region 24. A sonic shock is a shock wave (e.g., induced by a large impulse of sonic energy) that emanates from the vibration generator 64. Shock waves travel faster than the speed of sound in the medium (e.g., the material(s) of the active superhydrophobic surface structure 22, the layer(s) 36, and/or the elastomeric covering 28).

Vibration generators 64 generally are configured to shed ice, water, oil, dirt, and/or other contaminants from at least the controlled region 24 of the exposed surface 20. Vibration generators 64 may include, and/or may be, a sonic generator, a sonic transducer, an ultrasonic generator, an ultrasonic transducer, an acoustic resonator, and/or a piezoelectric actuator. Additionally or alternatively, MEMS actuators 30 may include one or more vibration generators 64. Vibration generators 64 may be arrayed under the controlled region 24 (in a regular, irregular, and/or random arrangement) and/or arranged in a layer 36 (e.g., within the elastomeric covering 28, interspersed in a layer with the MEMS actuator(s) 30, and/or in a layer below a layer of MEMS actuator(s) 30).

Active superhydrophobic surface structures 22 may comprise one or more heaters 66 that are configured to selectively heat the controlled region 24. Heaters 66 generally are configured to melt ice that may form on the controlled region 24 and/or to raise the temperature of the controlled region 24 to and/or above the local freezing point and/or dew point. MEMS actuators 30 and/or vibration generators 64 may include heaters 66. Heaters 66 may be arrayed under the controlled region 24 (in a regular, irregular, and/or random arrangement) and/or arranged in a layer 36 (e.g., within the elastomeric covering 28, interspersed in a layer with the MEMS actuator(s) 30, interspersed in a layer with the vibration generators 64, in a layer below a layer of MEMS actuator(s) 30, and/or in a layer below or above a layer of vibration generators 64).

Apparatus 10 may comprise a controller 62 and/or one or more sensors 60. The sensors 60 are configured to measure, to detect, and/or to determine properties related to the apparatus 10, the body 16, the exposed surface 20, the active superhydrophobic surface structure 22, the controlled region 24, the controlled group 26, one or more MEMS actuators 30, and/or the environment near (e.g., proximate to) any one or more of the foregoing. The property may include, and/or may be, temperature, speed of the apparatus 10 and/or one of its components, wind speed, wind direction, orientation of the apparatus 10 and/or one of its components (e.g., orientation of the exposed surface 20), angle of attack (angle of an object relative to the air velocity), humidity, and/or pressure. The sensor(s) 60 may be configured, collectively and/or individually, to measure, to detect, and/or to determine condensation conditions, icing conditions, environmental conditions, and/or exposed surface conditions.

Generally, the controller 62 is configured to control the active superhydrophobic surface structure 22 based on input (e.g., information, signal(s), etc.) from the sensor(s) 60. However, the controller 62 does not necessarily require sensors 60. For example, the controller 62 may control the active superhydrophobic surface structure 22 based upon a predetermined pattern and/or external input. Where the sensor(s) 60 are configured to measure a property affected by the state of the active superhydrophobic surface structure 22, the controller 62 may be configured to control the active superhydrophobic surface structure 22 in a feedback loop with the sensor(s) 60. Controllers 62 may include, and/or may be, a computer, a programmable logic controller, a power controller, and/or a power supply.

Controllers 62 may be configured to receive input from at least one sensor 60 (i.e., to receive the output of at least one sensor 60). Where the apparatus 10 includes avionics, the controller 62 may be configured to communicate with the avionics, for example, receiving input from the avionics (e.g., the avionics includes a sensor 60) and/or sending output to the avionics.

Controllers 62 are configured to transition the controlled region 24 of exposed surface 20 between the superhydrophobic state 42 and the ordinary state 44 by transitioning the MEMS actuator(s) 30 of the controlled group 26 between the activated state 32 and the deactivated state 34 (e.g., by activating and/or deactivating the MEMS actuator(s) 30). Controllers 62 may be configured to transition the controlled region 24 from the ordinary state 44 to the superhydrophobic state 42 based upon a detection of condensation conditions, a detection of icing conditions, a detection of environmental conditions, a detection of exposed surface conditions, a forecast of condensation conditions, a forecast of icing conditions, a forecast of environmental conditions, and/or a forecast of exposed surface conditions. Further, controllers 62 may control optional vibration generators 64 and/or optional heaters 66. For example, the controller 62 may be configured to activate the vibration generator 64 and/or the heater 66 based upon a detection of condensation conditions, a detection of icing conditions, a detection of environmental conditions, a detection of exposed surface conditions, a forecast of condensation conditions, a forecast of icing conditions, a forecast of environmental conditions, and/or a forecast of exposed surface conditions.

Active superhydrophobic surface structures 22 may be utilized to minimize water accumulation, to prevent water accumulation, to remove water accumulation, to remove ice accumulation, to prevent ice accumulation, to remove contamination, and/or to prevent contamination on the exposed surface 20. Methods of use may comprise activating the controlled region 24 by transitioning the controlled region 24 to the superhydrophobic state 42 from the ordinary state 44, and deactivating the controlled region 24 by transitioning the controlled region 24 to the ordinary state 44 from the superhydrophobic state 42. Where the apparatus 10 includes a sensor 60, the activating may include activating the controlled region 24 based upon a sensor output and/or the deactivating may include deactivating the controlled region 24 based upon a sensor output. The activating and/or the deactivating may include activating and/or deactivating, respectively, based upon a property of the apparatus 10, the body 16, the exposed surface 20, the active superhydrophobic surface structure 22, the controlled region 24, the controlled group 26, one or more MEMS actuators 30, and/or the environment near (e.g., proximate to) any one or more of the foregoing.

Methods may further comprise determining the presence of a condensation condition, an icing condition, an environmental condition, an exposed surface condition, a forecasted condensation condition, a forecasted icing condition, a forecasted environmental condition, and/or a forecasted exposed surface condition, and then transitioning the controlled region 24 to the superhydrophobic state 42. Controllers 62 may be configured and/or programmed to perform any of the foregoing methods.

Examples of inventive subject matter according to the present disclosure are described in the following enumerated paragraphs.

A1. An active superhydrophobic surface structure comprising:

an outer elastomeric covering defining an exposed surface;

a controlled group of one or more MEMS actuators at least covered by the outer elastomeric covering; and a controlled region of the exposed surface corresponding to the controlled group;

wherein the controlled region has a superhydrophobic state in which the controlled region is textured and an ordinary state in which the controlled region is smooth.

A2. The active superhydrophobic surface structure of paragraph A1, wherein the controlled region in the superhydrophobic state is superhydrophobic and, optionally, icephobic and/or oleophobic.

A3. The active superhydrophobic surface structure of any of paragraphs A1-A2, wherein the controlled region in the ordinary state is superhydrophobic, hydrophobic, hydrophilic, icephobic, oleophobic, oleophilic, and/or not superhydrophobic.

A4. The active superhydrophobic surface structure of any of paragraphs A1-A3, wherein a contact angle of water with the controlled region in the superhydrophobic state is greater than 150°, greater than 160°, and/or greater 170°.

A5. The active superhydrophobic surface structure of any of paragraphs A1-A4, wherein a contact angle of water with the controlled region in the superhydrophobic state is greater than a contact angle of water with the controlled region in the ordinary state.

A6. The active superhydrophobic surface structure of any of paragraphs A1-A5, wherein a contact angle of water with the controlled region in the ordinary state is less than 160°, less than 150°, less than 120°, less than 100°, less than 90°, less than 80°, less than 70°, less than 60°, greater than 70°, greater than 80°, greater than 90°, greater than 100°, greater than 120°, and/or greater than 150°.

A7. The active superhydrophobic surface structure of any of paragraphs A1-A6, wherein an average surface roughness of the controlled region in the superhydrophobic state is greater than an average surface roughness of the controlled region in the ordinary state.

A8. The active superhydrophobic surface structure of any of paragraphs A1-A7, wherein the controlled region in the superhydrophobic state has an average surface roughness of less than 100,000 nm, less than 10,000 nm, less than 3,000 nm, less than 1,000 nm, less than 300 nm, less than 100 nm, greater than 10 nm, greater than 30 nm, greater than 100 nm, greater than 300 nm, and/or greater than 1,000 nm.

A9. The active superhydrophobic surface structure of any of paragraphs A1-A8, wherein the controlled region in the ordinary state has an average surface roughness of less than 3,000 nm, less than 1,000 nm, less than 300 nm, less than 100 nm, less than 30 nm, less than 10 nm, greater than 1 nm, greater than 10 nm, greater than 30 nm, greater than 100 nm, and/or greater than 300 nm.

A10. The active superhydrophobic surface structure of any of paragraphs A1-A9, wherein the controlled group of one or more MEMS actuators is configured to selectively transition the controlled region between the superhydrophobic state and the ordinary state, optionally by actuation of the one or more MEMS actuators.

A11. The active superhydrophobic surface structure of any of paragraphs A1-A10, wherein, in the superhydrophobic state of the controlled region, each MEMS actuator of the controlled group is activated to deform a portion of the controlled region and wherein, in the ordinary state of the controlled region, each MEMS actuator of the controlled group is deactivated and the controlled region is unaffected by the controlled group of MEMS actuators.

A12. The active superhydrophobic surface structure of any of paragraphs A1-A10, wherein, in the ordinary state of the controlled region, each MEMS actuator of the controlled group is activated to deform a portion of the controlled region and wherein, in the superhydrophobic state of the controlled region, each MEMS actuator of the controlled group is deactivated and the controlled region is unaffected by the controlled group of MEMS actuators.

A13. The active superhydrophobic surface structure of any of paragraphs A1-A12, wherein each MEMS actuator of the controlled group has an activated state in which the MEMS actuator deforms a portion of the controlled region, and has a deactivated state in which the controlled region is unaffected by the MEMS actuator.

A13.1. The active superhydrophobic surface structure of paragraph A13, wherein the ordinary state of the controlled region corresponds to all of the MEMS actuators of the controlled group being in the deactivated state; and wherein the superhydrophobic state of the controlled region corresponds to all of the MEMS actuators of the controlled group being in the activated state.

A13.2. The active superhydrophobic surface structure of paragraph A13, wherein the superhydrophobic state of the controlled region corresponds to all of the MEMS actuators of the controlled group being in the deactivated state; and wherein the ordinary state of the controlled region corresponds to all of the MEMS actuators of the controlled group being in the activated state.

A14. The active superhydrophobic surface structure of any of paragraphs A1-A13.2, wherein the controlled region in at least one of the superhydrophobic state and the ordinary state includes a plurality of microprotrusions.

A14.1. The active superhydrophobic surface structure of paragraph A14, wherein the one or more MEMS actuators are configured to selectively form the microprotrusions.

A14.2. The active superhydrophobic surface structure of any of paragraphs A14-A14.1, wherein the microprotrusions are configured to trap gas between a drop of water on the controlled region and the controlled region.

A14.3. The active superhydrophobic surface structure of any of paragraphs A14-A14.2, wherein the microprotrusions include, optionally are, at least one of columns, posts, pins, filaments, ridges, ribs, cones, pyramids, lobes, projections, and convexities.

A14.4. The active superhydrophobic surface structure of any of paragraphs A14-A14.3, wherein an average spacing between microprotrusions is less than 100 µm, less than 30 µm, less than 10 µm, less than 3 µm, less than 1 µm, greater than 1 µm, greater than 3 µm, greater than 10 µm, and/or greater than 30 µm.

A14.5. The active superhydrophobic surface structure of any of paragraphs A14-A14.4, wherein the microprotrusions have an average height of less than 100 µm, less than 30 µm, less than 10 µm, less than 3 µm, less than 1 µm, greater than 1 µm, greater than 3 µm, greater than 10 µm, and/or greater than 30 µm.

A15. The active superhydrophobic surface structure of any of paragraphs A1-A14.5, wherein the controlled region in at least one of the superhydrophobic state and the ordinary state includes a plurality of nanoprotrusions.

A15.1. The active superhydrophobic surface structure of paragraph A15, wherein the one or more MEMS actuators are configured to selectively form the nanoprotrusions.

A15.2. The active superhydrophobic surface structure of any of paragraphs A15-A15.1, wherein the nanoprotrusions are configured to trap gas between a drop of water on the controlled region and the controlled region.

A15.3. The active superhydrophobic surface structure of any of paragraphs A15-A15.2, wherein the nanoprotrusions include, optionally are, at least one of asperities, columns, posts, filaments, ridges, ribs, clusters, particles, lobes, projections, and convexities.

A15.4. The active superhydrophobic surface structure of any of paragraphs A15-A15.3, wherein an average spacing between nanoprotrusions is less than 1,000 nm, less than 300 nm, less than 100 nm, less than 30 nm, less than 10 nm, less than 3 nm, greater than 1 nm, greater than 3 nm, greater than 10 nm, greater than 30 nm, and/or greater than 100 nm.

A15.5. The active superhydrophobic surface structure of any of paragraphs A15-A15.4, wherein the nanoprotrusions have an average height of less than 1,000 nm, less than 300 nm, less than 100 nm, less than 30 nm, less than 10 nm, less than 3 nm, greater than 1 nm, greater than 3 nm, greater than 10 nm, greater than 30 nm, and/or greater than 100 nm.

A16. The active superhydrophobic surface structure of any of paragraphs A1-A15.5, wherein the controlled region in the superhydrophobic state is at least one of micro-textured, nano-textured, and hierarchically textured.

A17. The active superhydrophobic surface structure of any of paragraphs A1-A16, wherein at least one, optionally each, MEMS actuator includes, optionally is, an electrostatic actuator, a thermal actuator, a piezoelectric actuator, an electromagnetic actuator, a thermopneumatic actuator, a thin film bulk acoustic resonator, a buckle beam thermal actuator, a piezoelectric material, a shape memory material, and/or a bimetallic material.

A18. The active superhydrophobic surface structure of any of paragraphs A1-A17, wherein the MEMS actuators are disposed under the controlled region at a surface density of at least 100, at least 1,000, at least 10,000, at least 100,000, at least 1,000,000, at most 10,000,000, at most 1,000,000, at most 100,000, at most 10,000, and/or at most 1,000 per square centimeter.

A19. The active superhydrophobic surface structure of any of paragraphs A1-A18, wherein the controlled group of one or more MEMS actuators is arranged in a layer of the active superhydrophobic surface structure.

A20. The active superhydrophobic surface structure of any of paragraphs A1-A19, wherein at least one, optionally each, MEMS actuator includes a vibration generator.

A21. The active superhydrophobic surface structure of any of paragraphs A1-A20, wherein at least one, optionally each, MEMS actuator is configured to selectively vibrate the controlled region and/or to selectively impart a shock into the controlled region.

A22. The active superhydrophobic surface structure of any of paragraphs A1-A21, wherein at least one, optionally each, MEMS actuator includes a heater.

A23. The active superhydrophobic surface structure of any of paragraphs A1-A22, wherein at least one, optionally each, MEMS actuator is configured to selectively heat the controlled region.

A24. The active superhydrophobic surface structure of any of paragraphs A1-A23, further comprising a plurality of vibration generators.

A24.1. The active superhydrophobic surface structure of paragraph A24, wherein each vibration generator includes, optionally is, a sonic generator, a sonic transducer, an ultrasonic generator, an ultrasonic transducer, an acoustic resonator, and a piezoelectric actuator.

A24.2. The active superhydrophobic surface structure of any of paragraphs A24-A24.1, wherein the vibration generators are configured to shed ice, water, oil, and/or dirt from the controlled region.

A24.3. The active superhydrophobic surface structure of any of paragraphs A24-A24.2, wherein the vibration generators are configured to selectively vibrate the controlled region and/or to selectively impart a sonic shock into the controlled region.

A24.4. The active superhydrophobic surface structure of any of paragraphs A24-A24.3, wherein at least one vibration generator is configured to heat the controlled region.

A24.5. The active superhydrophobic surface structure of any of paragraphs A24-A24.4, wherein the plurality of vibration generators is arranged in a layer of the active superhydrophobic surface structure.

A24.5.1. The active superhydrophobic surface structure of paragraph A24.5, wherein the controlled group of one or more MEMS actuators is arranged in the layer with the plurality of vibration generators.

A24.5.2. The active superhydrophobic surface structure of any of paragraphs A24.5-A24.5.1, wherein the controlled group of one or more MEMS actuators is arranged in a layer above the layer of vibration generators.

A25. The active superhydrophobic surface structure of any of paragraphs A1-A24.5.2, further comprising a heater, optionally a plurality of heaters, configured to selectively heat the controlled region.

A26. The active superhydrophobic surface structure of any of paragraphs A1-A25, wherein the active superhydrophobic surface structure includes a plurality of controlled groups and a plurality of controlled regions corresponding to the controlled groups.

A27. The active superhydrophobic surface structure of any of paragraphs A1-A26, wherein the outer elastomeric covering is at least one of superhydrophobic, hydrophobic, hydrophilic, icephobic, oleophobic, oleophilic, and not superhydrophobic.

A28. The active superhydrophobic surface structure of any of paragraphs A1-A27, wherein the outer elastomeric covering includes, optionally consists essentially of, at least one of silicone, polydimethylsiloxane, polyurethane, fluoropolymer, and pigment.

A29. The active superhydrophobic surface structure of any of paragraphs A1-A28, wherein the outer elastomeric covering encases the controlled group of one or more MEMS actuators.

A30. The use of the active superhydrophobic surface structure of any of paragraphs A1-A29 to shed water, to shed ice, to shed oil, to shed dirt, to prevent ice accumulation, to prevent oil accumulation, and/or to prevent dirt accumulation on the active superhydrophobic surface structure.

B1. An apparatus comprising:
a body;
wherein the body includes the active superhydrophobic surface structure of any of paragraphs A1-A29.

B2. The apparatus of paragraph B1, wherein the exposed surface is exposed to the atmosphere.

B3. The apparatus of any of paragraphs B1-B2, wherein the apparatus is a vehicle, optionally wherein the vehicle is at least one of an aircraft, an unmanned aerial vehicle, a rotorcraft, a land vehicle, a watercraft, and a spacecraft.

B4. The apparatus of any of paragraphs B1-B3, wherein the apparatus is a wind turbine, a tower, an electronic component, a consumer electronic product, a medical device, a hydraulic component, a pump, a mirror, a window, a solar panel, an electronic display, a touchscreen display, an optic, glasses, goggles, a building material, a building exterior, a textile, a packaging container, and/or an envelope.

B5. The apparatus of any of paragraphs B1-B4, wherein the body includes, optionally is, at least one of an airfoil, an aerodynamic component, a hull, a hydrodynamic component, a casing, a windshield, a nose cone, a radome, a superstructure, a wing, a tailplane, a horizontal stabilizer, a vertical stabilizer, an empennage, a fuselage, a skin, a propeller blade, a rotor blade, a turbine blade, a nacelle, and an engine cowling.

B6. The apparatus of any of paragraphs B1-B5, wherein the exposed surface is an airfoil surface.

B7. The apparatus of any of paragraphs B1-B6, wherein the body includes an aerodynamic component and/or an airfoil that has a leading edge.

B7.1. The apparatus of paragraph B7, wherein the active superhydrophobic surface structure is proximate to the leading edge.

B7.2. The apparatus of any of paragraphs B7-B7.1, wherein the controlled region includes the leading edge or does not include the leading edge.

B7.3. The apparatus of any of paragraphs B7-B7.2, wherein the active superhydrophobic surface structure is elongated with an elongated direction oriented at least one of parallel, substantially parallel, oblique, perpendicular, and substantially perpendicular to the leading edge.

B8. The apparatus of any of paragraphs B1-B7.3, further comprising a controller and/or one or more sensors.

B8.1. The apparatus of paragraph B8, wherein the apparatus is a system for controlling the active superhydrophobic surface on an exterior structure.

B8.2. The apparatus of any of paragraphs B8-B8.1, wherein at least one of the sensors is configured to measure a measured property, wherein the measured property is at least one of a property of the exposed surface, a property of the apparatus, and/or a property of an environment proximate to the apparatus.

B8.2.1. The apparatus of paragraph B8.2, wherein the measured property includes, optionally is, at least one of temperature, apparatus speed, wind speed, wind direction, apparatus orientation, exposed surface orientation, angle of attack, humidity, and pressure.

B8.3. The apparatus of any of paragraphs B8-B8.2.1, wherein one or more of the one or more sensors are configured, collectively and/or individually, to detect at least one of condensation conditions, icing conditions, an environmental condition, and an exposed surface condition.

B8.4. The apparatus of any of paragraphs B8-B8.3, wherein the controller is configured to control the controlled region based at least on information from the sensors, optionally in a feedback loop.

B8.5. The apparatus of any of paragraphs B8-B8.4, wherein the controller is configured to transition the one or more MEMS actuators between a/the activated state and a/the deactivated state.

B8.6. The apparatus of any of paragraphs B8-B8.5, wherein the controller is configured to transition the controlled region between the superhydrophobic state and the ordinary state by activating the one or more MEMS actuators of the controlled group to transition to the superhydrophobic state and by deactivating the one or more MEMS actuators of the controlled group to transition to the ordinary state.

B8.7. The apparatus of any of paragraphs B8-B8.6, wherein the controller is configured to transition the controlled region from the ordinary state to the superhydrophobic state based upon a detection of condensation conditions, a detection of icing conditions, a detection of environmental conditions, a detection of exposed surface conditions, a forecast of condensation conditions, a forecast of icing conditions, a forecast of environmental conditions, and/or a forecast of exposed surface conditions.

B8.8. The apparatus of any of paragraphs B8-B8.7, wherein the controller is configured to receive an output of at least one of the sensors.

B8.9. The apparatus of any of paragraphs B8-B8.8, wherein the apparatus comprises avionics and wherein the controller is configured to communicate with the avionics, optionally to receive input from the avionics and/or to send output to the avionics.

B8.10. The apparatus of any of paragraphs B8-B8.9, wherein the active superhydrophobic surface structure includes a vibration generator and wherein the controller is configured to activate the vibration generator, optionally based upon a detection of condensation conditions, a detection of icing conditions, a detection of environmental conditions, a detection of exposed surface conditions, a forecast of condensation conditions, a forecast of icing conditions, a forecast of environmental conditions, and/or a forecast of exposed surface conditions.

B8.11. The apparatus of any of paragraphs B8-B8.10, wherein the active superhydrophobic surface structure includes a heater and wherein the controller is configured to activate the heater, optionally based upon a detection of condensation conditions, a detection of icing conditions, a detection of environmental conditions, a detection of exposed surface conditions, a forecast of condensation conditions, a forecast of icing conditions, a forecast of environmental conditions, and/or a forecast of exposed surface conditions.

B9. The apparatus of any of paragraphs B1-B8.11, wherein the body includes a laminated structure that includes the exposed surface.

B9.1. The apparatus of paragraph B9, wherein the laminated structure includes an electrical wiring layer electrically connected to the one or more MEMS actuators of the controlled group.

B9.2. The apparatus of any of paragraphs B9-B9.1, wherein the laminated structure is a fiber-reinforced composite, and optionally includes carbon fiber, aramid fiber, glass fiber, resin, epoxy, and/or elastomer.

B10. The use of the apparatus of any of paragraphs B1-B9.2 to shed water, to shed ice, to shed oil, to shed dirt, to prevent ice accumulation, to prevent oil accumulation, and/or to prevent dirt accumulation on the apparatus.

C1. A method of minimizing water accumulation on the exposed surface of the apparatus of any of paragraphs B1-139.2, the method comprising:

activating the controlled region by transitioning the controlled region to the superhydrophobic state from the ordinary state; and deactivating the controlled region by transitioning the controlled region to the ordinary state from the superhydrophobic state.

C2. The method of paragraph C1, wherein the apparatus includes a sensor and the activating includes activating the controlled region based upon the same, or a different, sensor output and/or the deactivating includes deactivating the controlled region based upon a sensor output.

C3. The method of any of paragraphs C1-C2, wherein the activating includes activating based upon a property of the exposed surface, a property of the apparatus, and/or a property of an environment proximate to the apparatus.

C4. The method of any of paragraphs C1-C3, wherein the deactivating includes deactivating based upon a property of the exposed surface, a property of the apparatus, and/or a property of the environment proximate to the apparatus.

C5. The method of any of paragraphs C1-C4, further comprising determining the presence of at least one of a condensation condition, an icing condition, an environmental condition, an exposed surface condition, a forecasted condensation condition, a forecasted icing condition, a forecasted environmental condition, and a forecasted exposed surface condition and transitioning the controlled region to the superhydrophobic state.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function. Further, as used herein, the singular forms "a", "an" and "the" may be intended to include the plural forms as well, unless the context clearly indicates otherwise.

The various disclosed elements of apparatuses and steps of methods disclosed herein are not required of all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

In the event that any patents or patent applications are incorporated by reference herein and (1) define a term in a manner and/or (2) are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

The invention claimed is:

1. An active superhydrophobic surface structure comprising:
    an outer elastomeric covering defining an exposed surface;
    a controlled group of one or more MEMS actuators embedded within and covered by the outer elastomeric covering; and
    a controlled region of the exposed surface corresponding to the controlled group;
    wherein the controlled region is configured to be actively changed between a superhydrophobic state and a hydrophobic state as a result of the one or more MEMS actuators being activated or deactivated, wherein a contact angle of water with the controlled region in the superhydrophobic state is greater than 150°, and wherein a contact angle of water with the controlled region in the hydrophobic state is less than 150°; and
    wherein the controlled region in at least one of the superhydrophobic state and the hydrophobic state includes a plurality of nanoprotrusions projecting from a plurality of microprotrusions as a result of the one or more MEMS actuators being activated or deactivated, wherein the nanoprotrusions are spaced apart from one another with an average spacing of 1-1,000 nm and have an average height of 1-1,000 nm, and wherein the microprotrusions are spaced apart from one another with an average spacing of 1-100 µm and have an average height of 1-100 µm.

2. The active superhydrophobic surface structure of claim 1, wherein, in the superhydrophobic state, each MEMS actuator of the controlled group is activated to deform a portion of the controlled region and wherein, in the hydrophobic state of the controlled region, each MEMS actuator of the controlled group is deactivated and the controlled region is unaffected by the controlled group of MEMS actuators.

3. The active superhydrophobic surface structure of claim 1, wherein the controlled region in the superhydrophobic state includes the plurality of microprotrusions, and wherein the one or more MEMS actuators are configured to selectively form the microprotrusions.

4. The active superhydrophobic surface structure of claim 1, wherein the one or more MEMS actuators are configured to selectively form the nanoprotrusions.

5. The active superhydrophobic surface structure of claim 1, further comprising a plurality of vibration generators configured to selectively impart a sonic shock into the controlled region.

6. The active superhydrophobic surface structure of claim 5, wherein the plurality of vibration generators are interspersed with the one or more MEMS actuators within the outer elastomeric covering.

7. The active superhydrophobic surface structure of claim 5,
    wherein the active superhydrophobic surface structure is a laminated fiber-reinforced composite structure comprising:
        the outer elastomeric covering;
        an electrical wiring layer electrically connected to the one or more MEMS actuators; and
        a sublayer opposite the exposed surface relative to the outer elastomeric covering; and
    wherein the plurality of vibration generators are arranged within the sublayer of the laminated fiber-reinforced composite structure.

8. The active superhydrophobic surface structure of claim 1, further comprising a heater configured to selectively heat the controlled region.

9. The active superhydrophobic surface structure of claim 1, wherein the controlled region is in one of the superhydrophobic state and the hydrophobic state according to an activation state of the controlled group of the one or more MEMS actuators.

10. The active superhydrophobic surface structure of claim 1, wherein the outer elastomeric covering is hydrophobic, and further wherein an activation of the controlled group of the one or more MEMS actuators causes the controlled region to transition between the superhydrophobic state and the hydrophobic state.

11. The active superhydrophobic surface structure of claim 1, wherein each MEMS actuator of the controlled group has an activated state in which the MEMS actuator deforms a portion of the controlled region and has a deactivated state in which the controlled region is unaffected by the MEMS actuator, wherein the hydrophobic state of the controlled region corresponds to all of the MEMS actuators of the controlled group being in the deactivated state, and wherein the superhydrophobic state of the controlled region corresponds to all of the MEMS actuators of the controlled group being in the activated state.

12. The active superhydrophobic surface structure of claim 1, wherein the controlled region in the hydrophobic state consists of the plurality of microprotrusions, wherein the controlled region in the superhydrophobic state consists of the plurality of nanoprotrusions projecting from the plurality of microprotrusions.

13. The active superhydrophobic surface structure of claim 1, wherein the controlled region in the hydrophobic state consists of the plurality of nanoprotrusions, wherein the controlled region in the superhydrophobic state consists of the plurality of nanoprotrusions projecting from the plurality of microprotrusions.

14. The active superhydrophobic surface structure of claim 1, wherein the controlled region in one of the superhydrophobic state and the hydrophobic state consists of the plurality of nanoprotrusions, wherein the controlled region in the other one of the superhydrophobic state and the hydrophobic state consists of the plurality of microprotrusions.

15. An aircraft comprising:
an aerodynamic component with a leading edge;
a controller;
one or more sensors; and
the active superhydrophobic surface structure of claim 1;
wherein the active superhydrophobic surface structure is proximate to the leading edge; and
wherein the controller is configured to control the controlled region of the active superhydrophobic surface structure based at least on information from the one or more sensors in a feedback loop.

16. The aircraft of claim 15, wherein the controller is configured to transition the controlled region between the superhydrophobic state and the hydrophobic state by activating the one or more MEMS actuators of the controlled group to transition to the superhydrophobic state and by deactivating the one or more MEMS actuators of the controlled group to transition to the hydrophobic state.

17. The aircraft of claim 15, wherein the controlled region is in one of the superhydrophobic state and the hydrophobic state according to an activation state of the controlled group of the one or more MEMS actuators.

18. The aircraft of claim 15, wherein the outer elastomeric covering is hydrophobic, and further wherein an activation of the controlled group of the one or more MEMS actuators causes the controlled region to transition between the superhydrophobic state and the hydrophobic state.

19. An apparatus comprising:
a body; and
the active superhydrophobic surface structure of claim 1;
wherein the body includes the active superhydrophobic surface structure.

20. The apparatus of claim 19, wherein the body includes an aerodynamic component that has a leading edge, and wherein the active superhydrophobic surface structure is proximate to the leading edge.

21. The apparatus of claim 19, further comprising one or more sensors configured to detect at least one of an environmental condition and an exposed surface condition, and further comprising a controller configured to control the controlled region based at least on information from the sensors in a feedback loop.

22. The apparatus of claim 19, further comprising a controller configured to transition the controlled region between the superhydrophobic state and the hydrophobic state by activating the one or more MEMS actuators of the controlled group to transition to the superhydrophobic state and by deactivating the one or more MEMS actuators of the controlled group to transition to the hydrophobic state.

23. The apparatus of claim 19, further comprising a controller and one or more sensors, wherein the controller is configured to transition the controlled region from the hydrophobic state to the superhydrophobic state based upon a detection of condensation conditions, a detection of icing conditions, a forecast of condensation conditions, and/or a forecast of icing conditions.

24. The apparatus of claim 19, wherein the controlled region is in one of the superhydrophobic state and the hydrophobic state according to an activation state of the controlled group of the one or more MEMS actuators.

25. The apparatus of claim 19, wherein the outer elastomeric covering is hydrophobic, and further wherein an activation of the controlled group of the one or more MEMS actuators causes the controlled region to transition between the superhydrophobic state and the hydrophobic state.

* * * * *